US009958985B2

(12) United States Patent
Lin et al.

(10) Patent No.: US 9,958,985 B2
(45) Date of Patent: May 1, 2018

(54) TOUCH DISPLAY APPARATUS AND SHIFT REGISTER THEREOF

(71) Applicant: AU Optronics Corporation, Hsin-Chu (TW)

(72) Inventors: Chih-Lung Lin, Hsin-Chu (TW); Po-Chun Lai, Hsin-Chu (TW); Chia-En Wu, Hsin-Chu (TW); Chien-Chuan Ko, Hsin-Chu (TW); Meng-Chieh Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 167 days.

(21) Appl. No.: 15/189,468

(22) Filed: Jun. 22, 2016

(65) Prior Publication Data

US 2017/0123556 A1 May 4, 2017

(30) Foreign Application Priority Data

Nov. 4, 2015 (TW) .............................. 104136345 A

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01); *G09G 3/20* (2013.01); *G09G 3/3677* (2013.01); *G09G 3/3696* (2013.01); *G11C 19/28* (2013.01); *G09G 2300/0842* (2013.01); *G09G 2310/0267* (2013.01); *G09G 2310/0286* (2013.01)

(58) Field of Classification Search
CPC ...... G06F 3/0416; G06F 3/0412; G06F 3/044; G09G 3/20; G09G 3/3696; G09G 3/3677; G09G 2310/0267; G09G 2310/0286; G09G 2300/0842; G11C 19/28
See application file for complete search history.

(56) References Cited

U.S. PATENT DOCUMENTS 7,492,853 B2 * 2/2009 Tobita .................... G11C 19/28
377/64
8,155,261 B2 * 4/2012 Hu ......................... G11C 19/28
377/64

(Continued)

FOREIGN PATENT DOCUMENTS

CN 103489483 A 1/2014

*Primary Examiner* — Andrew Sasinowski
(74) *Attorney, Agent, or Firm* — WPAT, PC

(57) ABSTRACT

A shift register circuit includes a driving unit outputting a first scan signal according to a first clock signal; a pull up unit outputting a driving voltage according to one of a second scan signal and a third scan signal; a pull down unit pulling down voltage of an output end according to a second clock signal; a pull down control unit controlling the voltage of the output end and a driving node according to the first clock signal; a reset unit pulling down the voltage level of the driving node according to a touch-enable signal; and an electric storage unit adjusting the voltage of the driving node according to a touch-stop signal. When the touch-enable signal is enabled, the clock signals and the touch-stop signal are disabled, and when the touch-stop signal is enabled, the clock signals and the touch-enable signal are disabled.

19 Claims, 6 Drawing Sheets

(51) Int. Cl.
*G09G 3/36* (2006.01)
*G11C 19/28* (2006.01)
*G09G 3/20* (2006.01)

(56) References Cited

U.S. PATENT DOCUMENTS

| | | | |
|---|---|---|---|
| 8,681,085 B2* | 3/2014 | Kitagishi | G09G 3/3677 345/100 |
| 9,153,190 B2* | 10/2015 | Ahn | G09G 3/3677 |
| 9,368,230 B2* | 6/2016 | Yao | G11C 19/184 |
| 9,373,414 B2* | 6/2016 | Shang | G11C 19/28 |

* cited by examiner

TOUCH DISPLAY APPARATUS AND SHIFT
REGISTER THEREOF

TECHNICAL FIELD

The present invention generally relates to a display scan driver, and in particular, to a display scan driver suitable for a display having a touch function.

BACKGROUND

Recently, various LCD products have become popular for use in mobile hand-held devices. In addition, due to widespread use of smart end devices, integration of a touch function into smart end devices has become a mainstream demand for current products.

Referring to FIG. 1, a conventional touch display apparatus having a touch display function initiates a touch driver in a display-pause period for touch driving. As shown, FIG. 1 is a waveform schematic diagram of a conventional shift register having a touch display function, where a display panel has a plurality of scan lines, and a scan driver comprising multi-stage shift register circuits, a clock signal CK, scan signals G(n−1), G(n), and driving voltages Q(n−1), Q(n). In each frame period, the shift register circuits output the scan signals according to the clock signal to enable the corresponding scan lines of the display panel. For example, the shift register circuits may raise the driving voltage Q(n−1) of an internal driving node Q according to the clock signal CK to output the scan signal G(n−1). In a display-pause period, the shift register circuits are disabled and suspended from outputting the display scan signal G(n), and all of the external signals such as the clock signal CK are disabled therefore the driving voltage Q(n) of the driving node Q is in a floating state at this time, resulting in leakage of the driving voltage Q(n) of the driving node Q with time. The longer the external signals such as the clock signal CK are disabled, the more leakage of the driving voltage Q(n) will occur. When the display driving is restored, the scan signal G(n−1) has leakage due to the floating of the internal driving node of the display driving circuit in the display-pause period, causing failure of the scan signal G(n) after the display-pause period to output a correct voltage level, thereby degrading the display quality. In addition, the waveform distortion of the restored scan signal G(n) results in inconsistency between the time of a falling edge in the waveform and the time of a falling edge of scan signals from other stages, causing the mura effect. Moreover, the display-pause period generally occurs at a constant time frame for the scan lines. Since the driving nodes Q of the previous-stage and next-stage shift register circuits are also in the leakage state due to floating, a gate end of a driving transistor of the driving unit for pulling down the scan signals G(n−1), G(n) is continuously stressed, such that the threshold voltage of the driving transistor drifts.

Thus, how to prevent the driving transistor of the shift register circuits from being stressed for a long time, resulting in component performance deterioration and thus erroneous output is one of the important development issues today, and also has become an object urgently in need of improvement in related fields today.

SUMMARY OF THE INVENTION

An embodiment of the present invention provides a shift register, having multi-stage shift register circuits for outputting a plurality of scan signals, wherein each of the shift register circuits comprises a driving unit electrically connected to a driving node and outputting a first scan signal to an output end according to a first clock signal; a pull up unit outputting a driving voltage to the driving node according to one of a second scan signal and a third scan signal; a pull down unit electrically connected to the output end and a first voltage source and pulling down a voltage level of the output end according to a second clock signal, wherein the first clock signal and the second clock signal are phase-inverted periodic signals, and the first voltage source is a power source having a constant low voltage level; a pull down control unit electrically connected to the driving node, the output end and the first voltage source and controlling the voltage level of the output end and the driving node according to the first clock signal; a reset unit electrically connected between the driving node and the first voltage source, and pulling down a voltage level of the driving node according to a touch-enable signal; and an electric storage unit electrically connected to the driving node and adjusting the voltage level of the driving node according to a touch-stop signal. The electric storage unit comprises a first switch, a second switch, and a charging unit. Each of the switches has a first end, a second end and a gate end. The first end of the first switch is configured to receive the touch-stop signal, the second end of the first switch is connected to a first node, and the gate end of the first switch is connected to a second node. The first end of the second switch is electrically connected to the first node, the second end of the second switch is electrically connected to the driving node, and the gate end of the second switch is configured to receive the touch-stop signal. When the touch-enable signal is enabled, the first clock signal, the second clock signal and the touch-stop signal are disabled, and when the touch-stop signal is enabled, the first clock signal, the second clock signal and the touch-enable signal are disabled. The charging unit is electrically connected to the gate end of the first switch, and charges the second node according to a control signal. A first capacitor is electrically connected between the first node and the second node.

Another embodiment of the present invention provides a sensing display apparatus, comprising a sensing driver outputting a plurality of sensing driving signals according to a touch-enable signal to drive a sensing panel; and a scan driver outputting a plurality of scan signals to drive a display panel. In a period when the touch-enable signal is enabled, a timing controller disables a clock signal. The scan driver has multi-stage shift registers. Each of the shift registers comprises a driving unit electrically connected to a driving node and outputting a first scan signal to an output end according to a first clock signal; a pull up unit outputting a driving voltage to the driving node according to one of a second scan signal and a third scan signal; a pull down unit electrically connected to the output end and a first voltage source and pulling down a voltage level of the output end according to a second clock signal, wherein the first clock signal and the second clock signal are phase-inverted periodic signals, and the first voltage source is a power source having a constant low voltage level; a pull down control unit electrically connected to the driving node, the output end and the first voltage source and controlling the voltage level of the output end and the driving node according to the first clock signal; a reset unit electrically connected between the driving node and the first voltage source and pulling down a voltage level of the driving node according to the touch-enable signal; and an electric storage unit having an input end for receiving a touch-stop signal to charge the driving node, and comprising a first switch electrically connected to a node for receiving the touch-stop signal, a second switch electrically connected between the first switch and the driving node and turned on according to the touch-stop signal; a first capacitor electrically connected between the node and the second switch; and a charging unit electrically connected between the driving node and the node. When the driving node is in a high voltage level and the touch-stop signal is disabled, the node is in the high voltage level.

An embodiment of the present invention provides a driving method applicable to the abovementioned shift register, comprising in a first period of time, inputting the second clock signal to the shift register, such that the second node and the driving node have a high voltage level, and outputting the second scan signal; in a second period of time, enabling the touch-enable signal and inputting to the shift register, and disabling the clock signals, to pull down the driving node to a low voltage level, maintain the second node at the high voltage level, and pull down the first node to the low voltage level; in a third period of time, enabling the touch-stop signal and inputting to the shift register, and disabling the touch-enable signal and the clock signals, to raise the driving node, the first node and the second node to the high voltage level; and in a fourth period of time, enabling the clock signals and inputting to the shift register, and disabling the touch-enable signal and the touch-stop signal, to output the first scan signal.

The above description of the content of the present invention and the following illustration of the embodiments are intended to demonstrate and explain the spirit and principle of the present invention and to provide further explanations of the claims of the present invention.

BRIEF EXPLANATION OF DRAWINGS

These and other objectives, features, and advantages of the present invention will become apparent from the following description of the accompanying figures.

DETAILED DESCRIPTION OF THE INVENTION

Figure 1:
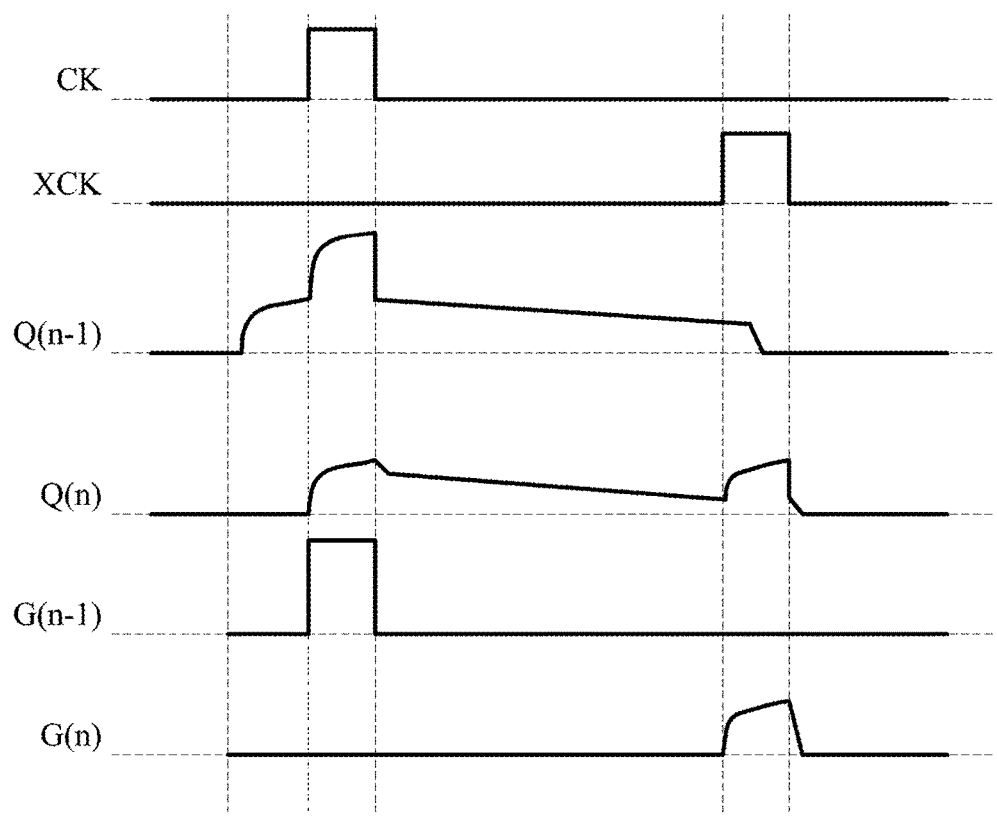
FIG. 1 is a waveform schematic diagram of a shift register according to the prior art.

Embodiments will be described below in detail in conjunction with the accompanying drawings, but the embodiments are not intended to limit the scope of the present invention. The order in which the operations of a structure are described is not to be construed as a limitation, and any structure which is a rearrangement of the components, and the resulting apparatus having an equivalent effect all fall within the scope of the present invention. In addition, the figures are merely illustrative and have not been drawn to scale. To facilitate understanding, same elements in the following description are labeled by the same reference numerals.

The terms "first", "second" and the like used herein do not denote any particular order or sequence, are not intended to limit the present invention, and are used only for distinguishing between elements or operations described with same technical terms.

Additionally, the terms "coupled" and "connected" used herein may mean that two or more elements are in a direct physical or electrical contact or in an indirect physical or electrical contact, and may also mean that two or more elements co-operate or interact.

Figure 2:
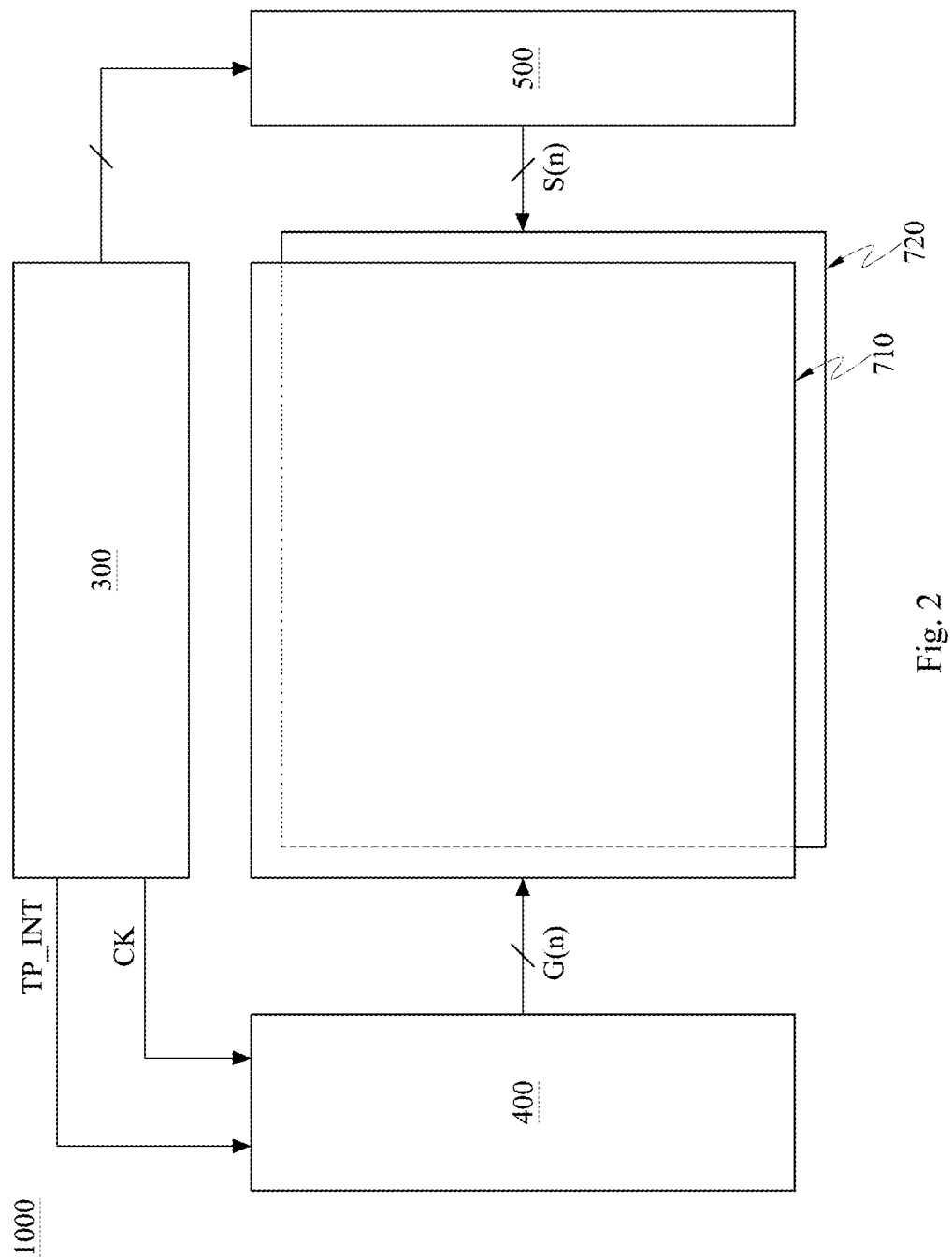
FIG. 2 shows a touch display apparatus according to an embodiment of the present invention.

FIG. 2 shows a touch display apparatus according to an embodiment of the present invention. The touch display apparatus 1000 comprises a scan driver 400 which outputs scan signals G(1)-G(N) for driving scan lines (not shown) of a display panel 710; and a touch driver 500 which outputs touch driving signals S(1)-S(N) for driving sensing lines (not shown) of a touch panel 720, wherein N is a positive integer. In a different embodiment, the number of touch driving signals S(n) can be different from the number of scan signals G(n). The touch panel 720 in the touch display apparatus 1000 may be a capacitive sensing panel, a photosensor panel, a resistive sensing panel, a proximity sensing panel or the like but is not limited thereto, and a capacitive touch panel is used as an example in an embodiment of the detailed description. The display panel 710 and the touch panel 720 may be an in-cell touch panel but is not limited thereto, and they may also be a combination of the display panel 710 and the touch panel 720. The scan driver 400 is configured to sequentially output the scan signals G(1)-G(N) to the display panel 710, and the scan driver may be a driving chip (not shown) adhered onto a substrate and may also be a gate on array (GOA) shift register but is not limited thereto. A timing controller 300 outputs signals such as a clock signal CK and a touch-enable signal TP_INT for driving and controlling the operation of the touch driver 500 and the scan driver 400. The touch-enable signal TP_INT may be a signal configured to be enabled by touching, a signal to suspend the display output, a signal to initiate the touch scan, or any external signal, and the touch-enable signal TP_INT may also be provided to the scan driver 400 directly or indirectly by the touch driver 500.

Figure 3:
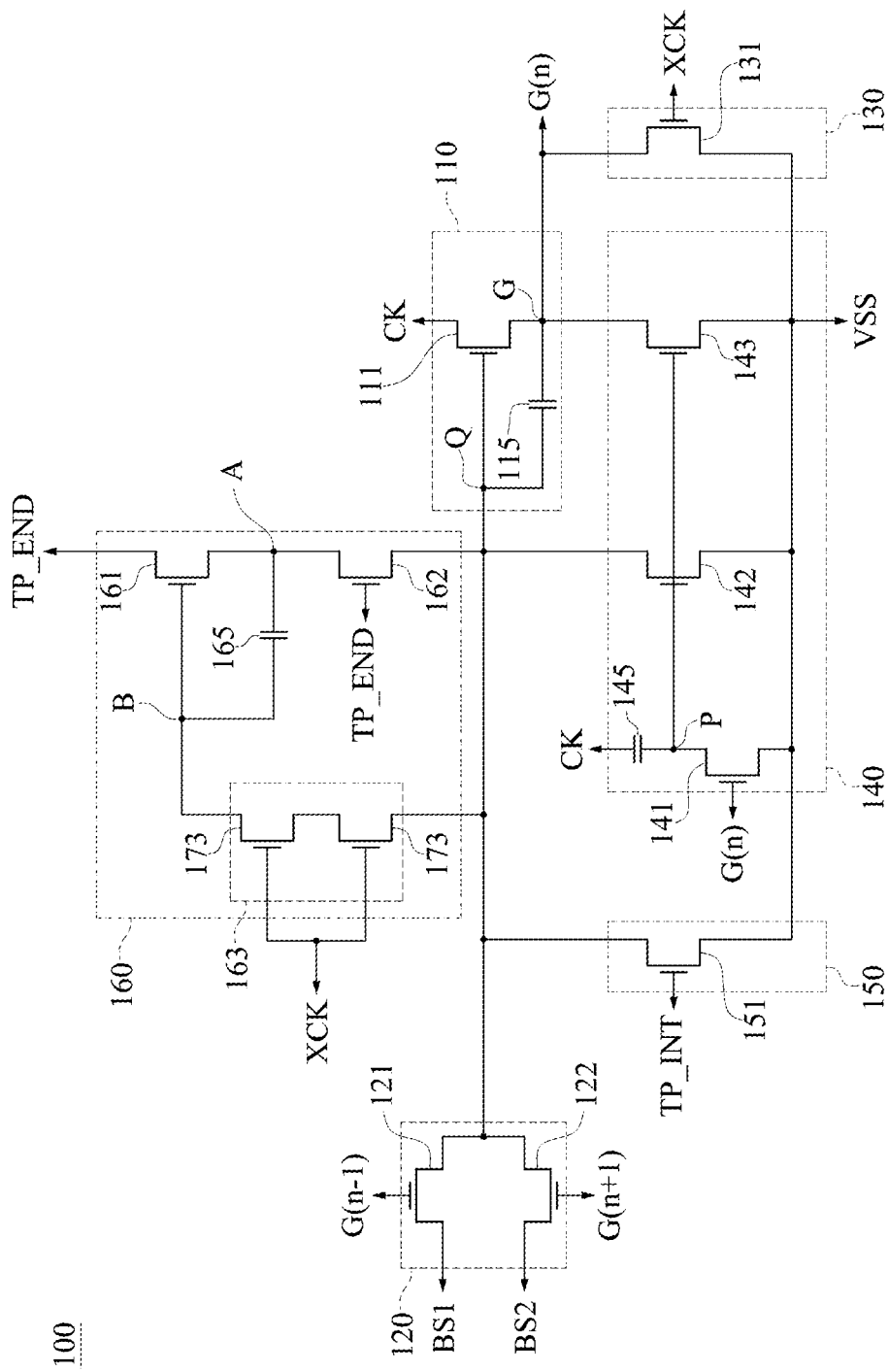
FIG. 3 shows a shift register circuit according to an embodiment of the present invention.

FIG. 3 shows one stage of the shift register circuits 100 of a shift register according to an embodiment of the present invention. The n-stage shift register circuit 100 has a driving unit 110, a pull up unit 120, a pull down unit 130, a pull down control unit 140, a reset unit 150, and an electric storage unit 160. The driving unit 110 comprises a transistor 111, the pull up unit 120 comprises a transistor 121, the pull down unit 130 comprises a transistor 131, the pull down control unit 140 comprises a transistor 141, a transistor 142 and a transistor 143, the reset unit 150 comprises a transistor 151, and the electric storage unit 160 comprises a transistor 161, a transistor 162 and a charging unit 163. Each of the transistors as described herein has a first end, a second end and a gate end, which will not be repeatedly described below.

The driving unit 110 outputs the scan signal G(n) according to the clock signal CK. The first end of the transistor 111 of the driving unit 110 is configured to receive the clock signal CK, the gate end of the transistor 111 is electrically connected to a driving node Q, and the second end of the transistor 111 is electrically connected to an output end G for outputting the scan signal G(n) according to the clock signal CK. The driving unit 110 also may comprise a capacitor 115 electrically connected between the second end of the transistor 111 and the gate end of the transistor 111, for maintaining the voltage of the transistor 111 from leaking.

The pull up unit 120 outputs a driving voltage Q(n) to the driving node Q according to the previous-stage scan signal G(n−1) or the next-stage scan signal G(n+1). The pull up unit 120 may be implemented in various ways. Taking a unidirectional scanning shift register circuit 100 as an example, the first end of the transistor 121 is electrically connected to the gate end of the transistor 121 for receiving the previous-stage scan signal, for example, the scan signal G(n−1), and the second end of the transistor 121 is electrically connected to the driving node Q. In another implementation of the unidirectional scanning shift register circuit 100, the first end of the transistor 121 of the pull up unit 120 is coupled to a constant-voltage source which may be a constant-voltage source having a high voltage level, the gate end of the transistor 121 is configured to receive the previous-stage scan signal, for example, the scan signal G(n−1), and the second end of the transistor 121 is electrically connected to the driving node Q.

In addition, the shift register circuit 100 of the present invention also may have a bidirectional scanning function, where the pull up unit 120 comprises the transistor 121 and a transistor 122, the first end of the transistor 121 is electrically connected to the first end of the transistor 122 for receiving a bidirectional control signal BS1, the second end of the transistor 121 and the second end of the transistor 122 are electrically connected to the driving node Q, the gate end of the transistor 121 is configured to receive the previous-stage scan signal, for example, the scan signal G(n−1), and the gate end of the transistor 121 is configured to receive the next-stage scan signal, for example, the scan signal G(n+1). As the scan driver 400 performs an up to down scanning, the bidirectional control signal BS1 is received by the transistor 121 according to whether the scan signal G(n−1) turns on the transistor 121, so as to charge the driving node Q; and as the scan driver 400 performs a down to up scanning, a bidirectional control signal BS2 is received by the transistor 122 according to whether the scan signal G(n+1) turns on the transistor 122, so as to charge the driving node Q. The bidirectional control signal BS1 and the bidirectional control signal BS2 may be phase-complementary periodic signals, and also may be constant-voltage sources having opposite voltage levels.

The pull down unit 130 pulls down the scan signal G(n) of the output end G according to a clock signal XCK opposite to the clock signal CK. The first end of the transistor 131 of the pull down unit 130 is electrically connected to the output end G, the gate end of the transistor 131 is configured to receive the clock signal XCK, the second end of the transistor 131 is electrically connected to a constant voltage source VSS. The constant voltage source VSS may be a constant voltage source having a low voltage level, and the clock signal CK and the clock signal XCK are periodic complements.

The pull down control unit 140 determines whether the voltage levels of the output end G and the driving node Q are pulled down according to the driving voltage Q(n). The first end of the transistor 141 is electrically connected to a capacitor 145 for receiving the clock signal CK, the gate end of the transistor 141 is electrically connected to the driving node Q, and the second end of the transistor 141 is electrically connected to the constant voltage source VSS. The capacitor 145 adjusts the potential of the clock signal CK received such that the voltage of a node P is coupled to a high voltage level, and it is determined whether the voltage level of the node P is to be pulled down according to the voltage level of the driving node Q. When the driving node Q is in a high voltage level, the transistor 141 is turned on to pull down the voltage level of the node P, and when the driving node Q is in a low voltage level, the transistor 141 is in a cut-off state and the transistors 142 and 143 are turned on to pull down the potential of the output end G and the driving node Q, and reduce the leakage current. The first end of the transistor 142 is electrically connected to the driving node Q, the gate end of the transistor 142 is electrically connected to the first end of the transistor 141, and the second end of the transistor 142 is electrically connected to the constant-voltage source VSS. The first end of the transistor 143 is electrically connected to the output end G, the gate end of the transistor 143 is electrically connected to the first end of the transistor 141, and the second end of the transistor 143 is electrically connected to the constant-voltage source VSS.

However, in addition to the connection methods above of the driving unit 110, the pull up unit 120, the pull down unit 130, and the pull down control unit 140, the shift register of the display scanner in the art of display devices may be implemented in various ways. However, one implementation is only taken as an example in this description, and the present invention is not limited thereto. Any connection method of the transistors capable of achieving the circuit having the function of the units above in connection with the driving waveform of the present invention is within the scope of the present invention.

The first end of the transistor 151 of the reset unit 150 is electrically connected to the driving node Q, the gate end of the transistor 151 is configured to receive the touch-enable signal TP_INT, and the second end of the transistor 151 is electrically connected to the voltage source VSS. The reset unit 150 mainly functions to turn on the transistor 151 according to triggering of the touch-enable signal TP_INT to pull down the voltage level of the driving node Q. The touch-enable signal TP_INT may be a signal provided by an external circuit such as the timing controller 300, and in the touch scan period (i.e. the display-pause period), the touch-enable signal TP_INT is enabled such that the scan driver 400 resets all of the shift register units 100 to suspend outputting the scan signals G(1)-G(N).

The electric storage unit 160 comprises the transistor 161, the transistor 162, the charging unit 163, and a capacitor 165. The first end of the transistor 161 is configured to receive a touch-stop signal TP_END, the second end of the transistor 161 is a node A, and the gate end of the transistor 161 is a node B. The capacitor 165 is electrically connected between the gate end of the transistor 161 and the second end of the transistor 161; namely, the capacitor 165 is electrically connected between the node A and the node B. The first end of the transistor 162 is electrically connected to the second end of the transistor 161, the gate end of the transistor 162 is configured to receive the touch-stop signal TP_END, and the second end of the transistor 162 is electrically connected to the driving node Q.

The charging unit 163 may be a component having three ends, where a first end is electrically connected to the gate end of the transistor 161, i.e. the node B, a second end is connected to the driving node Q, and a third end is configured to receive the clock signal XCK. The charging unit 163 may comprise one transistor 173 or multiple cascaded transistors 173. When the charging unit 163 uses a single transistor 173, in order to prevent the transistor 173 from being continuously stressed consequently having a decreased lifespan, the channel size of the transistor 173 may not be smaller than that of the remaining transistors of the shift register circuit 100. When the charging unit 163 uses multiple cascaded transistors 173, the channel size of the individual transistors 173 may be smaller than that of the remaining transistors of the shift register circuit 100, provided that the overall equivalent channel size of all of the transistors 173 is greater than that of the remaining transistors of the shift register circuit 100.

By making the charging unit 163 electrically connected between the node B and the driving node Q, the voltage level of the node B can be stabilized. The touch-stop signal TP_END may be a pulse signal. After the touch scan is stopped, the touch-enable signal TP_INT is disabled and the touch-stop signal TP_END is enabled, but at this time, the timing controller 300 has not been restored to provide the clock signal CK and the clock signal XCK to the scan driver 400, and the touch-stop signal TP_END charges the driving node Q first by the electric storage unit 160 to raise the voltage level of the driving node Q.

Figure 4:
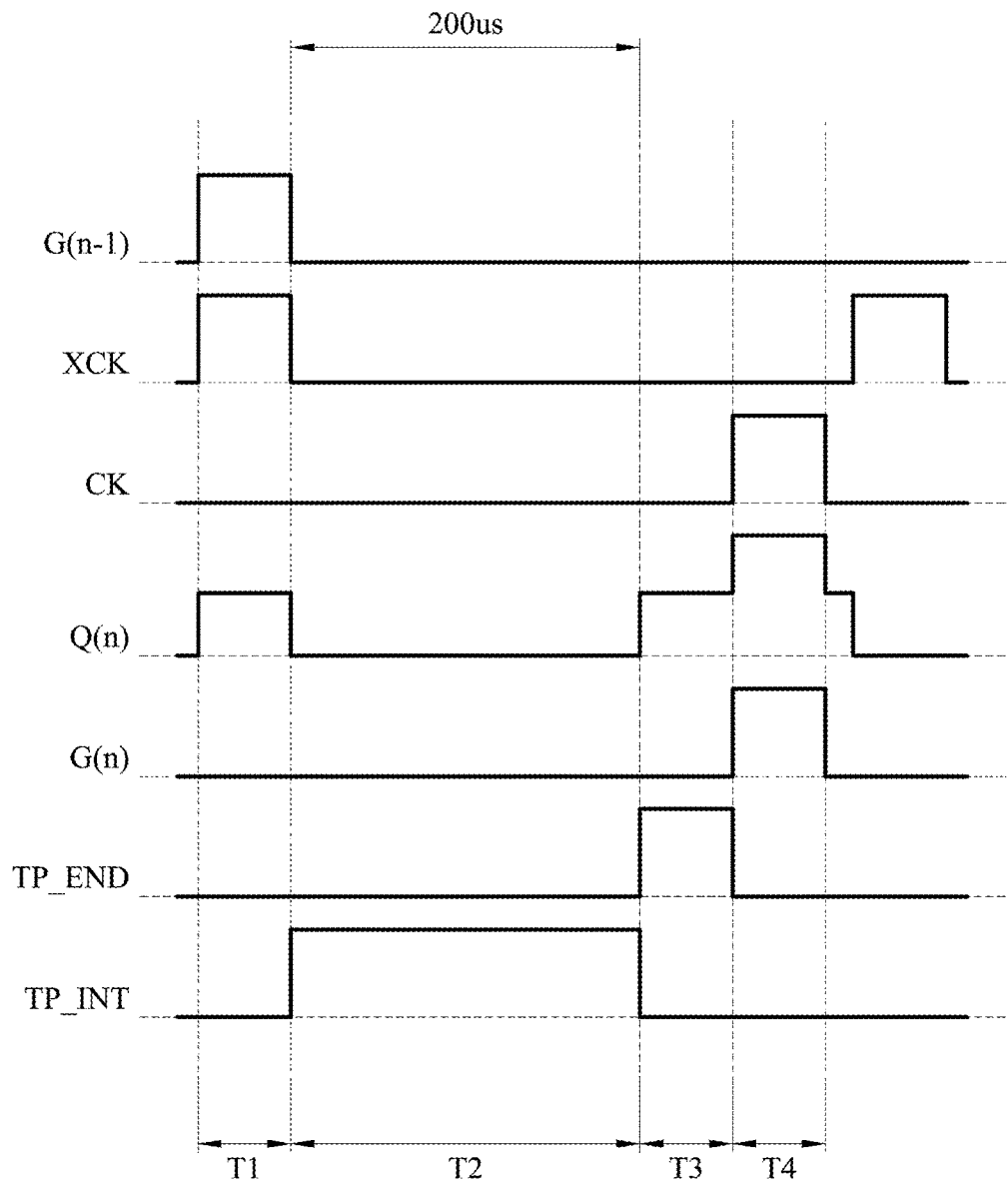
FIG. 4 is a waveform schematic diagram of the shift register circuit in FIG. 3 according to the embodiment of the present invention.

FIG. 4 is a waveform schematic diagram of the shift register circuit 100 in FIG. 3 according to an embodiment of the present invention. As shown, the clock signal CK and the clock signal XCK are phase-inverted and complementary periodic signals, and the periodic signals have a waveform repeatedly having a high voltage level and a low voltage level in one frame period. The period of time in which the touch-enable signal TP_INT may be provided to the touch controller 500 by the timing controller 300 or provided to the scan driver 400 by the touch display apparatus 1000 according to whether or not the touch controller 500 performs the scan function is named the touch scan period. In the touch scan period, in addition to the touch-enable signal TP_INT, the remaining external signals such as the clock signal CK that are provided to the scan driver 400 are disabled to suspend the operation of the scan driver 400. In a blanking period immediately after the touch scan period and before the restoration of the display driving, the touch-stop signal TP_END is provided to the scan driver 300, such that the voltage of the driving node Q of the corresponding-stage shift register unit 100 is raised to the high voltage level.

The operation of the shift register unit 100 is described below in connection with FIG. 3 and FIG. 4. Referring to FIG. 4, in a period of time T1, the clock signal XCK inverted with respect to the clock signal CK is in an enabled state, so the driving unit 110 of the (n−1)-stage shift register unit 100 outputs the scan signal G(n−1), and the scan signal G(n−1) is outputted to the scan line n−1 to drive the display panel 710. Also, the pull up unit 110 of the n-stage shift register unit 100 raises the driving voltage Q(n) of the driving node Q according to the scan signal G(n−1), and the transistor 141 of the pull down control unit 140 is turned on such that charges present in the capacitor 145 are released by the transistor 141, and at this time, the node P of the first end of the transistor 141 is in a low voltage level, and the transistors 142 and 143 are in a cut-off state. Since the clock signal XCK is in the enabled state, the transistor 131 of the pull down unit 130 is turned on for releasing charges of the output end G to pull down the voltage of the scan signal G(n) to the low voltage level. The transistor 111 of the driving unit 110 is electrically connected to the driving node Q and thus turned on, such that the charges of the output end G may also be released by the transistor 111. The charging unit 163 in the electric storage unit 160 is turned on at this time, therefore the voltage level of the node B is the same as that of the driving node Q, and thus the transistor 161 is turned on, such that the potential of the node A is pulled down to the low voltage level. In the period of time T1, the n-stage shift register circuit 100 mainly functions to release the charges of the output end G and also charge the driving node Q and charge the node B.

In a period of time T2 named the touch scan period, the timing controller 300 disables outputting the signals such as the clock signal CK that controls the scan driver, and also the touch-enable signal TP_INT is enabled for driving the touch controller 500 to perform the touch scan. Namely, the period of time T2 is a display-pause period of the touch display apparatus 1000. At this time, the shift register circuit 100 in the scan driver 400 suspends outputting the scan signals G(n)-G(N) because the external signals are disabled, and the original clock signal CK is disabled such that the driving voltage Q(n) of the driving node Q is in a floating state, but the transistor 151 of the reset unit 150 is turned on by the touch-enable signal TP_INT and thus pulls down the driving voltage Q(n) of the driving node Q to the low voltage level. The charging unit 163 in the electric storage unit 160 is in a closed state and does not pull the voltage of the node B to the driving node Q, and also still pulls down the voltage level of the node A. The transistor 111 of the driving unit 110 is in a cut-off state and does not output the scan signal G(n) in the period of time T2.

In a period of time T3 named a preparing period immediately after the touch scan period and before the restoration of the display driving, the touch scan is stopped, the touch-enable signal TP_INT is disabled, but the timing controller 500 has not been restored to provide the control signals such as the clock signal CK and the bidirectional control signals BS1-BS2 to the shift register circuit 100. Also, the touch-stop signal TP_END is provided to the shift register circuit 100. Since the voltage of the node B turns on the transistor 161, the potential of the node A is raised to the high voltage level through the touch-stop signal TP_END and also the transistor 162 is turned on to raise the driving node Q to the high voltage level. The transistor 111 is turned on at this time, but because the clock signal CK is in the low voltage level, the potential of the output end G is pulled down to the low voltage level. In the period of time T3, the shift register circuit 100 mainly functions to charge the driving node Q. In the period of time T3, the driving node Q may be charged at the n-stage shift register circuit 100, or may be charged at all stages of the shift register circuits 100.

In a period of time T4, the clock signal CK and the bidirectional control signal BS1 are re-enabled to restore the display scan. The clock signal CK and the bidirectional control signal BS1 are in the enabled state, the transistor 111 is turned on by the high voltage level of the driving node Q such that the clock signal CK passes through the transistor 111, and thus connecting the second end of the transistor 111 to the output end G and starts outputting the scan signal G(n). Since the transistor 141 is electrically connected to the driving node Q, the transistor 141 is turned on such that the node P is continuously maintained at the low voltage level, and the transistors 142 and 143 are in the cut-off state. At this time, the n− stage shift register circuits 100 mainly functions to output the scan signal G(n).

The transistors may be, for example, the same type of transistors or switches, e.g. N-type transistors (for example, N-type thin-film transistors or N-type metal-oxide-semiconductor-field-effect transistors), and the gate end of each transistor is the gate of the N-type transistor. As such, less photomasks may be used for manufacturing the shift register in the embodiment of the present invention, thereby simplifying the manufacture process of the shift register. However, the present invention is not limited thereto, and any switch having three ends or various types of transistors capable of achieving the circuit having the effect of the present invention in connection with the driving waveform of the present invention are within the scope of the present invention However, because the cascaded transistors 173 in the charging unit 163 are turned on according to the clock signal XCK, and the time in which the transistors 173 are stressed may be related to the duty cycle of the clock signal XCK. For example, in FIG. 4, the duty cycle of the clock signal XCK is 50%, so the transistors 173 are stressed 50% of the time. After a prolonged period of time, the charging capability of the driving node Q on the node B is decreased, such that the voltage outputted to the node A is also thus decreased, so that after restoring the display scan, the node Q of the n-stage shift register circuit 100 cannot be charged to the desired voltage level, and thus a correct waveform cannot be achieved by the outputted scan signal G(n), thereby resulting in the mura effect.

Figure 5:
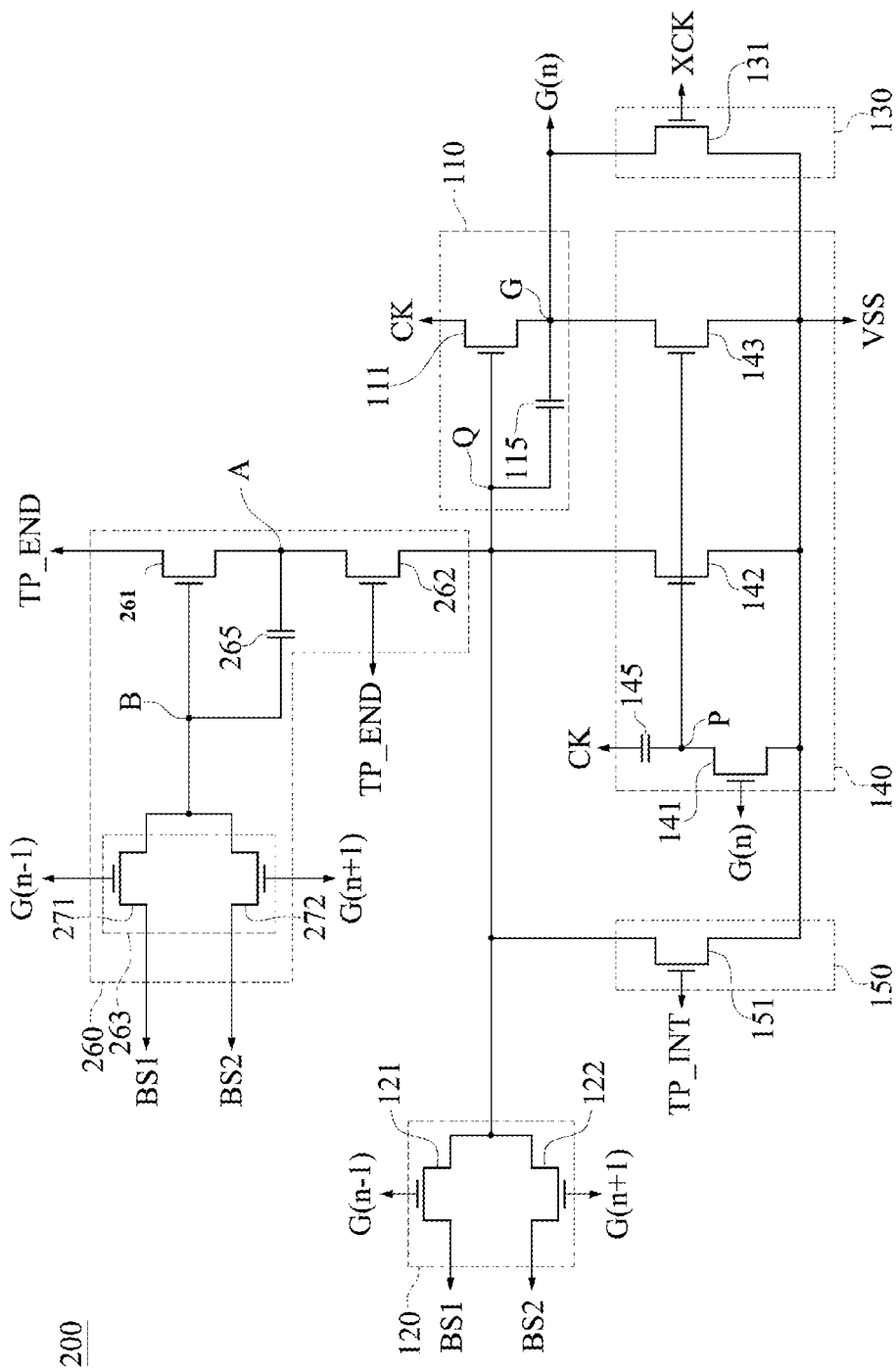
FIG. 5 shows a shift register circuit according to another embodiment of the present invention.
Figure 6:
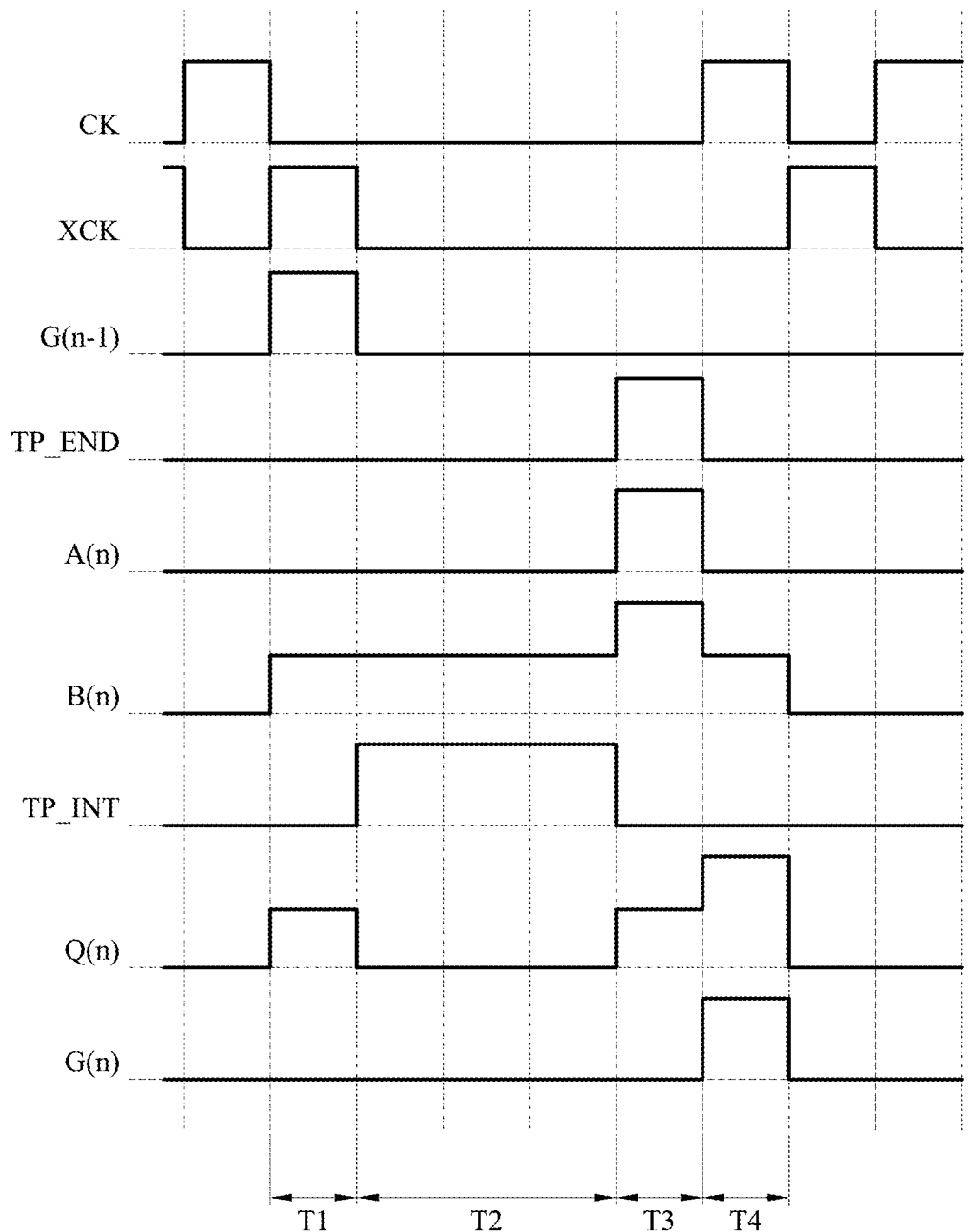
FIG. 6 is a waveform schematic diagram of the shift register circuit in FIG. 4 according to the embodiment of the present invention.

FIG. 5 shows an n-stage shift register circuit 200 of a shift register according to another embodiment of the present invention. The circuit structure and the circuit operation are substantially identical or similar to those of the shift register circuit 100, and not repeatedly described here. It should be noted that, the electric storage unit 260 of the shift register circuit 200 comprises a transistor 261, a transistor 262, a capacitor 265, and a charging unit 263. The charging unit 263 comprises a transistor 271 and a transistor 272. The first end of the transistor 271 is configured to receive a bidirectional control signal BS1, the second end of the transistor 271 and the second end of the transistor 272 are electrically connected to the node B, the gate end of the transistor 271 is configured to receive the previous-stage scan signal, for example, the scan signal G(n-1), and the gate end of the transistor 272 is configured to receive the next-stage scan signal, for example, the scan signal G(n+1). As the scan driver 400 performs an up to down scanning, the bidirectional control signal BS1 is received by the transistor 271 in the n-stage shift register circuit 200 according to whether the previous-stage scan signal G(n-1) enables the transistor 271, so as to charge the node B. As the scan driver 400 performs a down to up scanning, the bidirectional control signal BS2 is received by the transistor 272 of the n-stage shift register circuit 200 according to whether the scan signal G(n+1) enables the transistor 272, so as to charge the node B. The node B is charged in advance through the electric storage unit 260. The node B is charged with the scan signals by the charging unit 263 in the shift register circuit 200, which can improve the waveform distortion because the transistor 173 of the shift register circuit 100 is stressed for a long time.

The present invention also provides a display apparatus adapted for use with the shift register circuit 100 of the present invention, for example, the touch display apparatus 1000 as shown in FIG. 2. When the timing controller 300 outputs the touch-enable signal TP_INT to the scan driver 400 and the touch driver 500, the shift register 100 in the scan driver 400 suspends outputting. The time in which the touch-enable signal TP_INT is enabled may be a blanking period between two adjacent frame periods, a blanking period between two adjacent scan signals, a period in which occurrence of a touch event is detected by the touch display apparatus 1000, or a period in which the scan driver 400 is instructed to stop outputting, which is not limited to the touch enable period only. The time in which the touch-stop signal TP_END is enabled may be a time after the completion of the touch scan is detected and before the restoration of the display scan. Generally, the touch-stop signal TP_END is a pulse signal, and the touch-enable signal TP_INT is a signal that is always maintained at the enabled state in a period of the touch scan. Whenever the scan driver 400 is instructed to stop outputting the scan signals to the display panel 710, the shift register circuit 100 disclosed in the present invention may be used to prevent an incorrect waveform outputted by the scan driver 400. The touch-enable signal TP_INT and the touch-stop signal TP_END may be provided by the timing controller 300 or may be provided by the touch driver 500. However, the present invention is not limited thereto, and it is to be clearly understood by those skilled in the art that the present invention can be achieved as long as the signals inputted to the shift register circuit 100 also make other external signals disabled.

The present invention also provides an integrated mobile device adapted for use with the shift register circuit 100 of the present invention, for example, a touch display apparatus, a photo-sensing display apparatus, a fingerprint-recognizing display apparatus, or the like. Whenever the scan driver 400 is instructed to stop outputting the scan signals to the display panel 710, the shift register circuit 100 disclosed in the present invention may be used to prevent an incorrect waveform outputted by the scan driver 400, thereby improving the display quality. However, the present invention is not limited thereto, and an integrated driving apparatus comprising two or more drivers can be used with the shift register disclosed in an embodiment of the present invention, so as to prevent an incorrect waveform outputted by the drivers.

In sum, according to a shift register circuit provided by the present invention, a driving circuit and a driving method are disclosed, in which an internal node is charged again through an electric storage unit after operation of the shift register circuit is suspended, in order to prevent incorrect display due to leakage of the internal node in the shift register circuit and ensure a correct waveform outputted by the shift register circuit.

While the present invention has been disclosed above with the embodiments, these embodiments are not intended to limit the present invention. All alterations and modifications fall within the scope of the disclosure, without departing from the spirit and scope of the disclosure. Regarding the scope of patent protection as defined by the scope of the present invention, refer to the appended claims.

What is claimed is:
1. A shift register circuit, comprises:
a driving unit electrically connected to a driving node and outputting a first scan signal to an output end according to a first clock signal;
a pull up unit outputting a driving voltage to the driving node according to one of a second scan signal and a third scan signal;
a pull down unit, electrically connected to the output end and a first voltage source, for pulling down an output end voltage level of the output end according to a second clock signal;
a pull down control unit, electrically connected to the driving node, the output end, and the first voltage source, for controlling the output end voltage level and a driving node voltage level of the driving node according to the first clock signal; and
a reset unit, electrically connected between the driving node and the first voltage source, for pulling down the driving node voltage level according to a touch-enable signal;
wherein the driving node voltage is adjusted according to a touch-stop signal.
2. The shift register circuit according to claim 1, wherein the first clock signal and the second clock signal are comple- mentary periodic signals, and the first voltage source is a power source having a constant low voltage level.

3. The shift register circuit according to claim 1, further comprising an electric storage unit, wherein the electric storage unit comprises:
    a first switch having a first end, a second end and a gate end, wherein the first end of the first switch is configured to receive the touch-stop signal, the second end of the first switch is connected to a first node, and the gate end of the first switch is connected to a second node;
    a second switch having a first end, a second end and a gate end, wherein the first end of the second switch is electrically connected to the first node, the second end of the second switch is electrically connected to the driving node, and the gate end of the second switch is configured to receive the touch-stop signal, wherein when the touch-enable signal is enabled, the first clock signal, the second clock signal and the touch-stop signal are disabled, and when the touch-stop signal is enabled, the first clock signal, the second clock signal and the touch-enable signal are disabled;
    a first capacitor electrically connected between the first node and the second node; and
    a charging unit electrically connected to the gate end of the first switch and charging the second node according to a control signal.

4. The shift register circuit according to claim 1, wherein the driving unit comprises:
    a third switch having a first end, a second end and a gate end, wherein the first end of the third switch is configured to receive the first clock signal, the second end of the third switch is electrically connected to the output end, and the gate end of the third switch is electrically connected to the driving node; and
    a second capacitor electrically connected between the gate end of the third switch and the output end.

5. The shift register circuit according to claim 1, wherein the reset unit comprises:
    a fourth switch having a first end, a second end and a gate end, wherein the first end of the fourth switch is electrically connected to the driving node, the gate end of the fourth switch is configured to receive the touch-enable signal, and the second end of the fourth switch is electrically connected to the first voltage source.

6. The shift register circuit according to claim 1, wherein the pull down control unit comprises:
    a fifth switch having a first end, a second end and a gate end, wherein the gate end of the fifth switch is electrically connected to the driving node, and the second end of the fifth switch is electrically connected to the first voltage source;
    a sixth switch having a first end, a second end and a gate end, wherein the first end of the sixth switch is electrically connected to the driving node, the gate end of the sixth switch is electrically connected to the first end of the fifth switch, and the second end of the sixth switch is electrically connected to the first voltage source;
    a seventh switch having a first end, a second end and a gate end, wherein the first end of the seventh switch is electrically connected to the output end, the gate end of the seventh switch is electrically connected to the first end of the fifth switch, and the second end of the seventh switch is electrically connected to the first voltage source; and
    a third capacitor having a first end and a second end, wherein the first end of the third capacitor is configured to receive the first clock signal, and the second end of the third capacitor is electrically connected to the first end of the fifth switch.

7. The shift register circuit according to claim 1, wherein the pull down unit comprises:
    an eighth switch having a first end, a second end and a gate end, wherein the first end of the eighth switch is electrically connected to the output end, the gate end of the eighth switch is configured to receive the first clock signal, and the second end of the eighth switch is electrically connected to the first voltage source.

8. The shift register circuit according to claim 1, wherein the pull up unit comprises:
    a ninth switch having a first end, a second end and a gate end, wherein the first end of the ninth switch is electrically connected to the gate end of the ninth switch for receiving the second scan signal, and the second end of the ninth switch is electrically connected to the driving node.

9. The shift register circuit according to claim 8, wherein the charging unit comprises:
    an eleventh switch having a first end, a second end and a gate end, wherein the first end of the eleventh switch is configured to receive the second bidirectional control signal, the second end of the eleventh switch is electrically connected to the second node, and the gate end of the eleventh switch is configured to receive the second scan signal; and
    a twelfth switch having a first end, a second end and a gate end, wherein the first end of the twelfth switch is configured to receive the first bidirectional control signal, the second end of the twelfth switch is electrically connected to the second node, and the gate end of the twelfth switch is configured to receive the third scan signal.

10. The shift register circuit according to claim 1, wherein the pull up unit comprises:
    a ninth switch having a first end, a second end and a gate end, wherein the first end of the ninth switch is electrically connected to a second voltage source, the second end of the ninth switch is electrically connected to the driving node, and the gate end of the ninth switch is configured to receive the second scan signal, wherein the second voltage source is a power source having a constant high voltage level.

11. The shift register circuit according to claim 1, wherein the pull up unit comprises:
    a ninth switch having a first end, a second end and a gate end, wherein the first end of the ninth switch is electrically connected to a first bidirectional control signal, the second end of the ninth switch is electrically connected to the driving node, and the gate end of the ninth switch is configured to receive the second scan signal; and
    a tenth switch having a first end, a second end and a gate end, wherein the first end of the tenth switch is electrically connected to a second bidirectional control signal, the second end of the tenth switch is electrically connected to the driving node, and the gate end of the tenth switch is configured to receive the third scan signal, wherein the first bidirectional control signal and the second bidirectional control signal are phase-inverted with respect to each other.

12. The shift register circuit according to claim 1, wherein the charging unit comprises:
    at least one transistor each having a first end, a second end and a gate end, wherein the at least one transistor are sequentially cascaded, and an overall equivalent channel size of the at least one transistor is greater than a channel size of each of the switches.

13. A touch display apparatus, comprising:
a sensing driver outputting a plurality of touch scan signals to drive a touch panel according to a touch-enable signal; and
a display driver outputting a plurality of display scan signals to drive a display panel according to a plurality of clock signals and a touch-stop signal, wherein when the touch-enable signal is enabled, the clock signals and the touch-stop signal are disabled, and when the touch-stop signal is enabled, the clock signals and the touch-enable signal are disabled, wherein the display driver has multi-stage shift register circuits connected to each other, and each of the shift register circuits comprises:
   a driving unit electrically connected to a driving node and outputting a first scan signal to an output end according to a first clock signal;
   a pull up unit outputting a driving voltage to the driving node according to one of a second scan signal and a third scan signal;
   a pull down unit electrically connected to the output end and a voltage source, being configured to pull down an output end voltage level of the output end according to a second clock signal;
   a pull down control unit electrically connected to the driving node, the output end, and the first voltage source, for controlling the output end voltage level and a driving node voltage level the driving node according to the first clock signal; and
   a reset unit electrically connected between the driving node and the first voltage source, for pulling down the driving node voltage level when the touch-enable signal is enabled;
   wherein the driving node is charged according to the touch-stop signal.

14. The touch display apparatus according to claim 13, wherein the first clock signal and the second clock signal are phase-inverted periodic signals, and the voltage source is a power source having a constant low voltage level.

15. The touch display apparatus according to claim 13, further comprising an electric storage unit, wherein the electric storage unit further comprises:
   a first switch electrically connected to a node and configured to receive the touch-stop signal;
   a second switch electrically connected between the first switch and the driving node and turned on according to the touch-stop signal;
   a first capacitor electrically connected between the node and the second switch; and
   a charging unit electrically connected between the node and the driving node, wherein when the driving node is in a high voltage level and the touch-stop signal is disabled, the node is in the high voltage level.

16. The touch display apparatus according to claim 13, wherein the reset unit comprises:
   a third switch having a first end, a second end and a gate end, wherein the first end of the third switch is electrically connected to the driving node, the gate end of the third switch is configured to receive the touch-enable signal, and the second end of the third switch is electrically connected to the first voltage source.

17. The touch display apparatus according to claim 13, wherein the charging unit comprises:

a fourth switch having a first end, a second end and a gate end, wherein the first end of the fourth switch is configured to receive a second bidirectional control signal, the second end of the fourth switch is electrically connected to the node, and the gate end of the fourth switch is configured to receive the second scan signal; and
a fifth switch having a first end, a second end and a gate end, wherein the first end of the fifth switch is configured to receive a first bidirectional control signal, the second end of the fifth switch is electrically connected to the node, and the gate end of the fifth switch is configured to receive the third scan signal, wherein the first bidirectional control signal and the second bidirectional control signal are phase-inverted with respect to each other, and the enabled periods of the first scan signal, the second scan signal and the third scan signal are not overlapped with each other.

18. The touch display apparatus according to claim 13, wherein the charging unit comprises:
   at least one transistor each having a first end, a second end and a gate end, wherein the first end of one of the at least one transistor is electrically connected to the node, the second end of another one of the at least one transistor is connected to the driving node, the first end of the remainder of the at least one transistor is connected to the second end of the at least one transistor sequentially cascaded, and the gate end of each of the at least one transistor is configured to receive the touch-stop signal, and an overall equivalent channel size of the at least one transistor is greater than a channel size of each of the switches.

19. A scan driving method adapted to a shift register circuit, wherein said shift register circuit comprises
   a driving unit electrically connected to a driving node and outputting a first scan signal to an output end according to a first clock signal;
   a pull up unit outputting a driving voltage to the driving node according to one of a second scan signal and a third scan signal;
   a pull down unit, electrically connected to the output end and a first voltage source, for pulling down an output end voltage level of the output end according to a second clock signal, wherein the first clock signal and the second clock signal are complementary periodic signals, and the first voltage source is a power source having a constant low voltage level;
   a pull down control unit, electrically connected to the driving node, the output end, and the first voltage source, for controlling the output end voltage level and a driving node voltage level of the driving node according to the first clock signal;
   a reset unit, electrically connected between the driving node and the first voltage source, for pulling down the driving node voltage level according to a touch-enable signal; and
   an electric storage unit, electrically connected to the driving node, for adjusting the driving node voltage level according to a touch-stop signal; wherein the electric storage unit further comprises:
      a first switch having a first end, a second end and a gate end, wherein the first end of the first switch is configured to receive the touch-stop signal, the second end of the first switch is connected to a first node, and the gate end of the first switch is connected to a second node;

a second switch having a first end, a second end and a gate end, wherein the first end of the second switch is electrically connected to the first node, the second end of the second switch is electrically connected to the driving node, and the gate end of the second switch is configured to receive the touch-stop signal, wherein when the touch-enable signal is enabled, the first clock signal, the second clock signal and the touch-stop signal are disabled, and when the touch-stop signal is enabled, the first clock signal, the second clock signal and the touch-enable signal are disabled;

a first capacitor electrically connected between the first node and the second node; and a charging unit electrically connected to the gate end of the first switch and charging the second node according to a control signal, the driving method comprising:

in a first period of time, providing the second clock signal to the shift register, such that the second node and the driving node have a high voltage level, and outputting the second scan signal;

in a second period of time, providing the touch-enable signal to the shift register, and disabling the clock signals, to pull down the driving node to a low voltage level, maintain the second node at the high voltage level, and pull down the first node to the low voltage level;

in a third period of time, providing the touch-stop signal to the shift register, and disabling the touch-enable signal and the clock signals, to raise the driving node, the first node and the second node to the high voltage level; and in a fourth period of time, providing the clock signals to the shift register, and disabling the touch-enable signal and the touch-stop signal, to output the first scan signal.

* * * * *